(12) United States Patent
Choi (10) Patent No.: US 6,242,812 B1
(45) Date of Patent: Jun. 5, 2001

(54) CSP PIN CONFIGURATION COMPATIBLE WITH TSOP PIN CONFIGURATION

(75) Inventor: Joo Sun Choi, Ichon-shi (KR)

(73) Assignee: Hyundai Electronics Industries Co., Ltd., Ichon-shi (KR)

( * ) Notice: Subject to any disclaimer, the term of this patent is extended or adjusted under 35 U.S.C. 154(b) by 0 days.

(21) Appl. No.: 09/323,837

(22) Filed: Jun. 2, 1999

(30) Foreign Application Priority Data

Jun. 2, 1998 (KR) .................................................. 98-20465

(51) Int. Cl.[7] ........................... H01L 23/48; H01L 23/52; H01L 29/40
(52) U.S. Cl. ........................ 257/781; 257/773; 257/778; 257/786; 257/779
(58) Field of Search .................................... 257/773, 778, 257/780, 781, 794, 796, 786

(56) References Cited

U.S. PATENT DOCUMENTS

| | | |
|---|---|---|
| 5,723,903 | 3/1998 | Masuda et al. . |
| 5,894,107 | 4/1999 | Lee et al. . |
| 5,920,118 * | 7/1999 | Kong ..................................... 257/684 |
| 6,013,946 * | 1/2000 | Lee et al. ............................... 257/684 |

* cited by examiner

*Primary Examiner*—Terry D. Cunningham
*Assistant Examiner*—Quan Tra
(74) *Attorney, Agent, or Firm*—Jacobson, Price, Holman & Stern, PLLC

(57) ABSTRACT

The present invention relates to a pin configuration in a highly integrated memory chip; and, more particularly, to a CSP pin configuration which is compatible with a TSOP pin configuration. A CSP semiconductor device according to the present invention comprises: a die pad area formed in the middle of a semiconductor chip; a first ball pad area allocated at a left side of the die pad area, having a ball array having first and second columns; and a second ball pad area allocated at a right side of the die pad area, having a ball array having first and second columns, wherein the first ball pad area includes ball pads which are positioned at a right side of a corresponding TSOP, wherein the second ball pad area includes ball pads which are positioned at a left side of the corresponding TSOP, wherein the first column of the first ball pad area includes even number pins of the corresponding TSOP, which are disposed in order of lower priority, and the second column of the first ball pad area includes odd number pins of the corresponding TSOP, which are disposed in order of lower priority, and wherein the first column of the second ball pad area includes even number pins of the corresponding TSOP, which are disposed in order of higher priority, and the second column of the second ball pad area includes odd number pins of the TSOP, which are disposed in order of higher priority.

18 Claims, 11 Drawing Sheets

FIG. 1
(PRIOR ART)

400mil X 875mil
66Pin TSOP-II

Pin Pitch=0.65mm

| Pin | Description |
|---|---|
| A0–A11 | Row/Column Address |
| BA0, BA1 | Bank Select Address |
| DQ0–DQ15 | Data Input/Output |
| /CS | Chip Select |
| /RAS | Row Address Strobe |
| /CAS | Column Address Strobe |
| /WE | Write Enable |
| LDM, UDM | Write Mask(Low/Upper Byte) |
| CLK, /CLK | Clock Input |
| CKE | Clock Enable |
| LDQS, UDQS | Data Strobe(Low/Upper Byte) |
| VREF | Reference Voltage |
| VDD, VSS | Power, Ground |
| VDDQ, VSSQ | I/O Power, I/O Ground |
| /QFC | DQ FET Switch Control(optional) |
| NC | No Connection |

X16 section

| | e | f |
|---|---|---|
| 1 | DQ0 | VDD |
| 2 | DQ1 | VDDQ |
| 3 | VSSQ | DQ2 |
| 4 | DQ4 | DQ3 |
| 5 | DQ5 | VDDQ |
| 6 | VSSQ | DQ6 |
| 7 | VDDQ | DQ7 |
| 8 | VDD | LQS |
| 9 | LDM | /WE |
| 10 | /RAS | /CAS |
| 11 | NC | /CS |
| 12 | BA1 | BA0 |
| 13 | A0 | A10/AP |
| 14 | A2 | A1 |
| 15 | VDD | A3 |

| | a | b |
|---|---|---|
| 1 | VSS | DQ15 |
| 2 | VSSQ | DQ14 |
| 3 | DQ13 | VDDQ |
| 4 | DQ12 | DQ11 |
| 5 | VSSQ | DQ10 |
| 6 | DQ9 | VDDQ |
| 7 | DQ8 | VSSQ |
| 8 | UQS | NC, VREF |
| 9 | VSS | UDM |
| 10 | /CLK | CLK |
| 11 | CKE | NC |
| 12 | A11 | A9 |
| 13 | A8 | A7 |
| 14 | A6 | A5 |
| 15 | A4 | VSS |

X8 section

| | e | f |
|---|---|---|
| 1 | DQ0 | VDD |
| 2 | NC | VDDQ |
| 3 | VSSQ | DQ1 |
| 4 | DQ2 | NC |
| 5 | NC | DQ3 |
| 6 | VSSQ | NC |
| 7 | VDDQ | NC |
| 8 | VDD | NC |
| 9 | NC | /WE |
| 10 | /RAS | /CAS |
| 11 | NC | /CS |
| 12 | BA1 | BA0 |
| 13 | A0 | A10/AP |
| 14 | A2 | A1 |
| 15 | VDD | A3 |

| | a | b |
|---|---|---|
| 1 | VSS | DQ7 |
| 2 | VSSQ | NC |
| 3 | DQ6 | VDDQ |
| 4 | NC | DQ5 |
| 5 | VSSQ | NC |
| 6 | DQ4 | VDDQ |
| 7 | NC | VSSQ |
| 8 | QS | NC, VREF |
| 9 | VSS | DM |
| 10 | /CLK | CLK |
| 11 | CKE | NC |
| 12 | A11 | A9 |
| 13 | A8 | A7 |
| 14 | A6 | A5 |
| 15 | A4 | VSS |

X4 section

| | e | f |
|---|---|---|
| 1 | NC | VDD |
| 2 | NC | VDDQ |
| 3 | VSSQ | DQ0 |
| 4 | NC | NC |
| 5 | NC | VDDQ |
| 6 | VSSQ | DQ1 |
| 7 | VDDQ | NC |
| 8 | VDD | NC |
| 9 | NC | /WE |
| 10 | /RAS | /CAS |
| 11 | NC | /CS |
| 12 | BA1 | BA0 |
| 13 | A0 | A10/AP |
| 14 | A2 | A1 |
| 15 | VDD | A3 |

| | a | b |
|---|---|---|
| 1 | VSS | NC |
| 2 | VSSQ | NC |
| 3 | DQ3 | VDDQ |
| 4 | NC | NC |
| 5 | VSSQ | NC |
| 6 | DQ2 | VDDQ |
| 7 | NC | VSSQ |
| 8 | QS | NC, VREF |
| 9 | VSS | DM |
| 10 | /CLK | CLK |
| 11 | CKE | NC |
| 12 | A11 | A9 |
| 13 | A8 | A7 |
| 14 | A6 | A5 |
| 15 | A4 | VSS |

FIG. 6B

| | X4 | | X8 | | X16 | | | | |
|---|---|---|---|---|---|---|---|---|---|
| | e | f | | e | f | | e | f | |
| 1 | VSS | NC | 1 | VSS | DQ7 | 1 | VSS | DQ15 | DQ0 | VDD |
| 2 | VSSQ | NC | 2 | VSSQ | NC | 2 | VSSQ | DQ14 | NC | VDDQ |
| 3 | DQ3 | VDDQ | 3 | DQ6 | VDDQ | 3 | DQ13 | VDDQ | VSSQ | DQ0 |
| 4 | NC | NC | 4 | NC | DQ5 | 4 | DQ12 | DQ11 | DQ2 | NC |
| 5 | VSSQ | VSSQ | 5 | VSSQ | NC | 5 | VSSQ | DQ10 | NC | VDDQ |
| 6 | DQ2 | VDDQ | 6 | DQ4 | VDDQ | 6 | DQ9 | VDDQ | VSSQ | DQ1 |
| 7 | NC | VSSQ | 7 | NC | VSSQ | 7 | DQ8 | VSSQ | VDDQ | NC |
| 8 | QS | NC,VREF | 8 | QS | NC,VREF | 8 | UQS | NC,VREF | VDD | NC |
| 9 | VSS | DM | 9 | VSS | DM | 9 | VSS | UDM | LDM | /WE |
| 10 | /CLK | CLK | 10 | /CLK | CLK | 10 | /CLK | CLK | /RAS | /CAS |
| 11 | CKE | NC | 11 | CKE | NC | 11 | CKE | NC | NC | /CS |
| 12 | A11 | A9 | 12 | A11 | A9 | 12 | A11 | A9 | BA1 | BA0 |
| 13 | A8 | A7 | 13 | A8 | A7 | 13 | A8 | A7 | A0 | A10/AP |
| 14 | A6 | A5 | 14 | A6 | A5 | 14 | A6 | A5 | A2 | A1 |
| 15 | A4 | VSS | 15 | A4 | VSS | 15 | A4 | VSS | VDD | A3 |

FIG. 6C

| | | X16 | | | | | | | | | | | | | | | |
|---|---|---|---|---|---|---|---|---|---|---|---|---|---|---|---|---|---|
| | | | f | VDD | VDDQ | DQ2 | DQ3 | VDDQ | DQ6 | DQ7 | LQS | /WE | /CAS | /CS | BA0 | A10/AP | A1 | A3 |
| | | | e | DQ0 | DQ1 | VSSQ | DQ4 | DQ5 | VSSQ | VDDQ | VDD | LDM | /RAS | NC | BA1 | A0 | A2 | VDD |
| | X8 | | | 1 | 2 | 3 | 4 | 5 | 6 | 7 | 8 | 9 | 10 | 11 | 12 | 13 | 14 | 15 |
| | | | b | DQ15 | DQ14 | VDDQ | DQ11 | DQ10 | VDDQ | VSSQ | NC, VREF | UDM | CLK | A12 | A9 | A7 | A5 | VSS |
| | | | a | VSS | VSSQ | DQ13 | DQ12 | VSSQ | DQ9 | DQ8 | UQS | VSS | /CLK | CKE | A11 | A8 | A6 | A4 |

X8 section (middle-upper):

| | f | VDD | VDDQ | DQ1 | NC | VDDQ | DQ3 | NC | NC | /WE | /CAS | /CS | BA0 | A10/AP | A1 | A3 |
|---|---|---|---|---|---|---|---|---|---|---|---|---|---|---|---|---|
| | e | DQ0 | NC | VSSQ | DQ2 | NC | VSSQ | VDDQ | VDD | NC | /RAS | NC | BA1 | A0 | A2 | VDD |

X4 section (top):

| | f | VDD | VDDQ | DQ0 | NC | VDDQ | DQ1 | NC | NC | /WE | /CAS | /CS | BA0 | A10/AP | A1 | A3 |
|---|---|---|---|---|---|---|---|---|---|---|---|---|---|---|---|---|
| | e | NC | NC | VSSQ | NC | NC | VSSQ | VDDQ | VDD | NC | /RAS | NC | BA1 | A0 | A2 | VDD |

X8 section (lower):

| | b | DQ7 | NC | VDDQ | DQ5 | NC | VDDQ | VSSQ | NC, VREF | DM | CLK | A12 | A9 | A7 | A5 | VSS |
|---|---|---|---|---|---|---|---|---|---|---|---|---|---|---|---|---|
| | a | VSS | VSSQ | DQ6 | NC | VSSQ | DQ4 | NC | QS | VSS | /CLK | CKE | A11 | A8 | A6 | A4 |

X4 section (bottom):

| | b | NC | NC | VDDQ | NC | NC | VDDQ | VSSQ | NC, VREF | DM | CLK | A12 | A9 | A7 | A5 | VSS |
|---|---|---|---|---|---|---|---|---|---|---|---|---|---|---|---|---|
| | a | VSS | VSSQ | DQ3 | NC | VSSQ | DQ2 | NC | QS | VSS | /CLK | CKE | A11 | A8 | A6 | A4 |

CSP PIN CONFIGURATION COMPATIBLE WITH TSOP PIN CONFIGURATION

FIELD OF THE INVENTION

The present invention relates to a pin configuration in a highly integrated memory chip; and, more particularly, to a CSP (Chip Size Package) pin configuration which is compatible with a TSOP (Thin Small Outline Package) pin configuration.

DESCRIPTION OF THE PRIOR ART

In the case of high-speed operation chips or chips having many I/O pins, it is a recent tendency to adopt new package techniques such as CSP and BGA (Ball Grid Array) for safe operation between. semiconductor circuits and interfacing circuits. Generally, the standards of package types, the number of pins and pin rotation of products related to semiconductor memory are discussed or decided by JEDEC (Joint Electronics Device Engineering Council) under the influence of EIA (Electronic Industries Association) in U.S.A.

Figure 1:
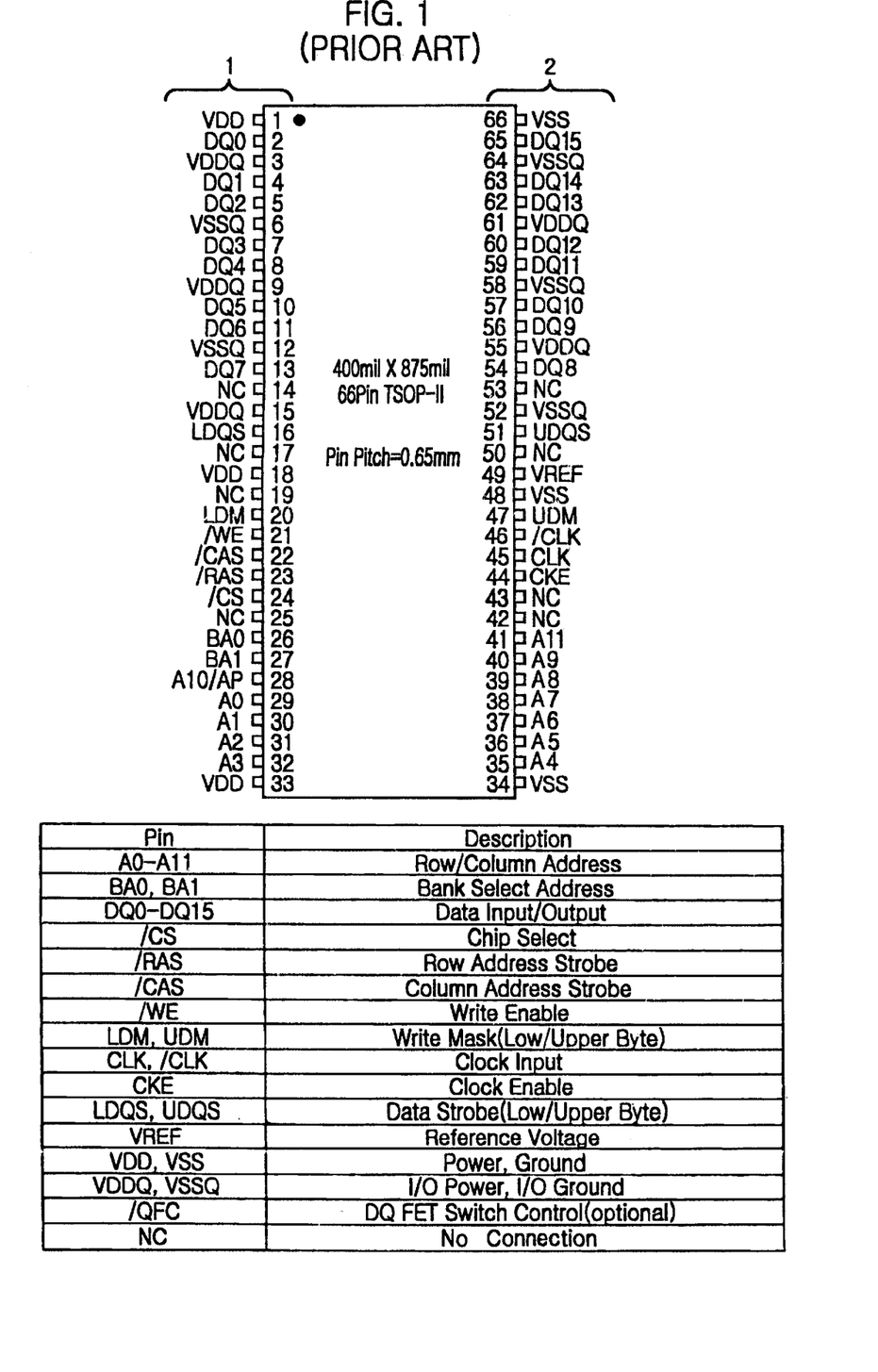
FIG. 1 is a top view of a 66-pin configuration of a conventional TSOP.
Figure 2:
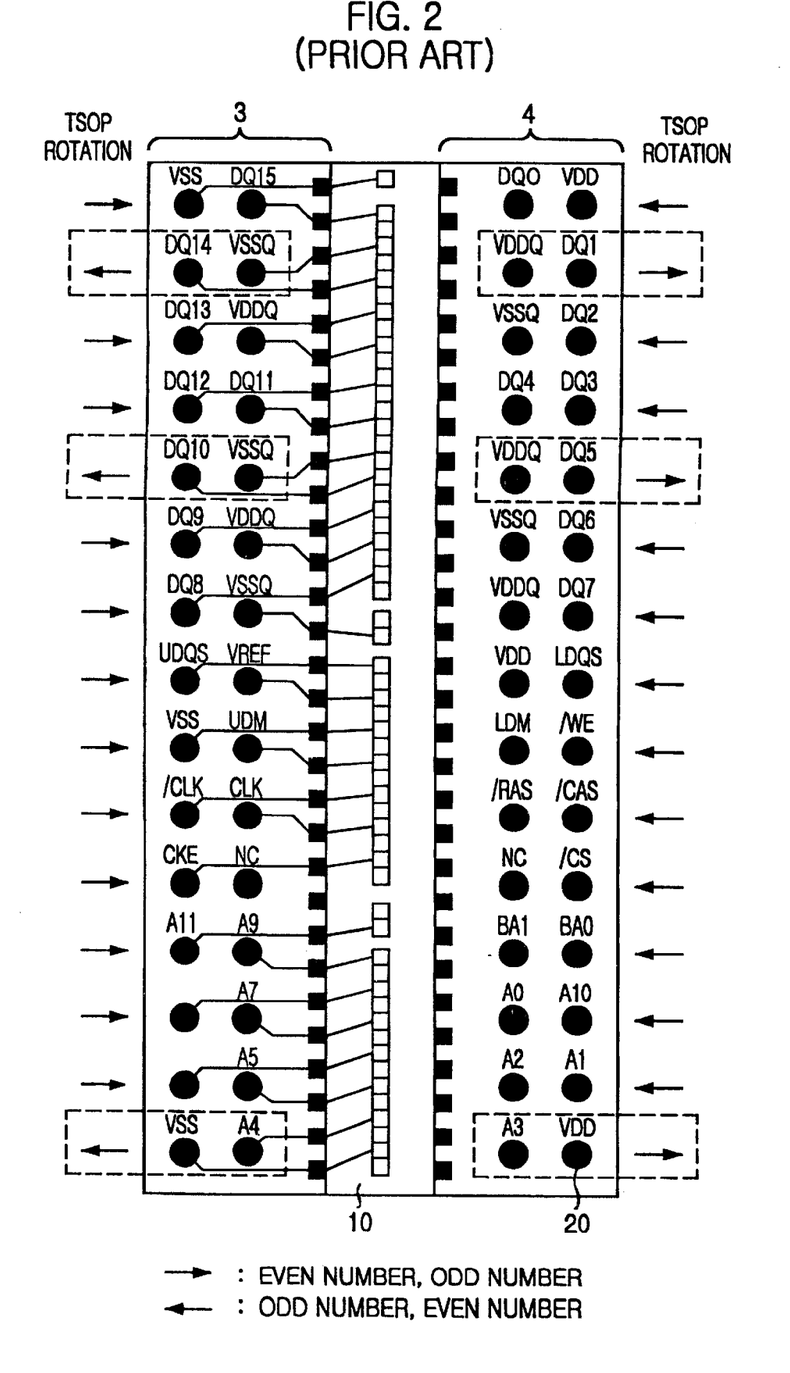
FIG. 2 is a top view of a 60-pin configuration of a conventional CSP corresponding to the FIG. 1.

FIG. 1 is a top view of a 66-pin configuration of a conventional TSOP chip. As shown in FIG. 1, pin configuration of the conventional TSOP chip has two parts. One (left side) of them has 33 pins and the other (right side) of them has 33 pins. FIG. 2 is a top plane view illustrating CSP 60-pin rotation suggested by EIAJ (Electronics Industry Association Japan), which corresponds to the pin rotation of conventional TSOP 66-pin chip. In the drawing, the reference numeral 10 denotes a die, 20 a ball, 3 CSP left side in which right pins (right side 2) of TSOP are arranged, 4 CSP right side in which left pins (left side 2) of TSOP are arranged, respectively.

As shown in FIGS. 1 and 2, the left pins in FIG. 1 are arranged in the right side 4 in FIG. 2 and the right pins in FIG. 1 are arranged in the left side 3 in FIG. 2. Also, comparing FIG. 1 with FIG. 2, the VSS and DQ15 pins in FIG. 1 are arranged in the first row of left side 3 of FIG. 2 and the DQ14 and VSSQ pins in FIG. 1 are arranged in the second row of left side 3 of FIG. 2.

However, it is easily recognized that pin rotation in the second, fifth and fifteen rows shown in dotted line of FIG. 2 is different from the conventional TSOP pin rotation (FIG. 1). That is, odd number pins are arranged in the second column in the second, fifth and fifteen rows, but even number pins are arranged in the first column in other rows. In this pin rotation, there are two routing layers between balls of the second row and the third row and between balls of the fifth row and the sixth row.

According to such CSP pin rotation, dies that are designed and produced for the TSOP cannot be compatible with the CSP and the wiring between balls is relatively difficult. Especially, such a wire structure bringing out a cause of signal interference may make the capacity lowered.

Figure 3A:
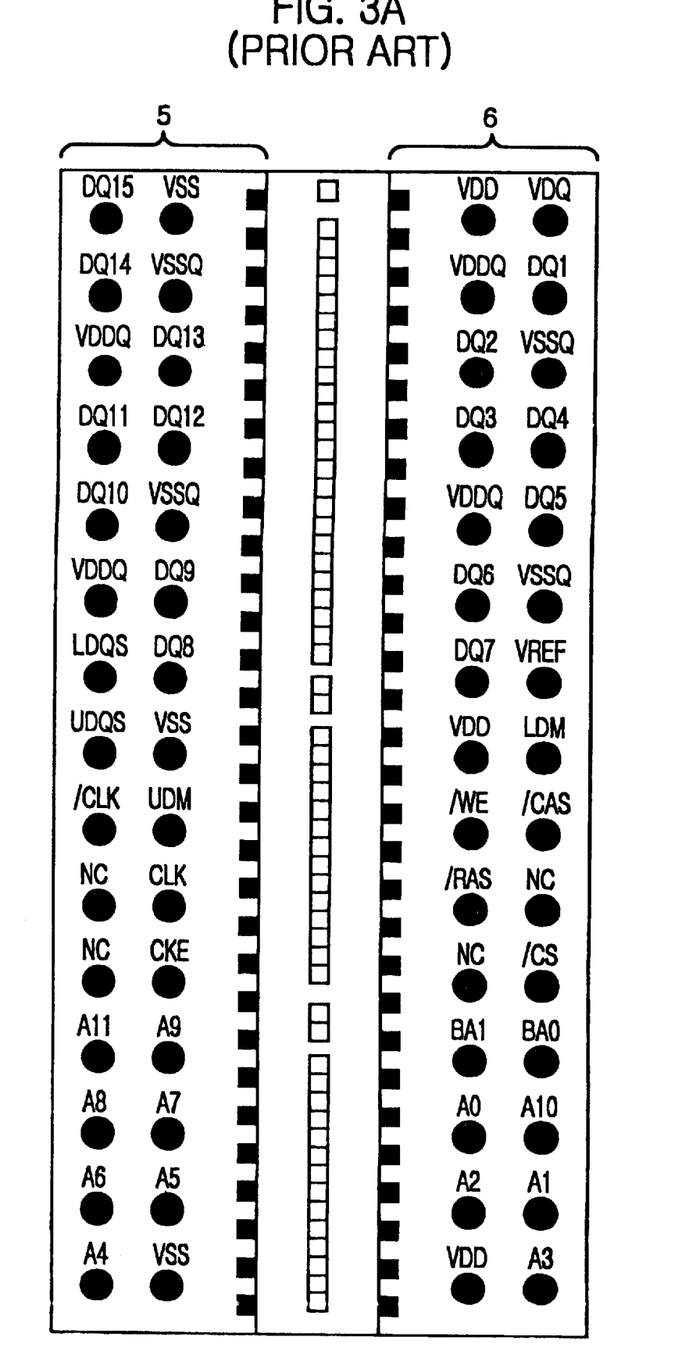
FIG. 3a is a top view of a 60-pin configuration of the another conventional CSP corresponding to the FIG. 1.
Figure 3B:
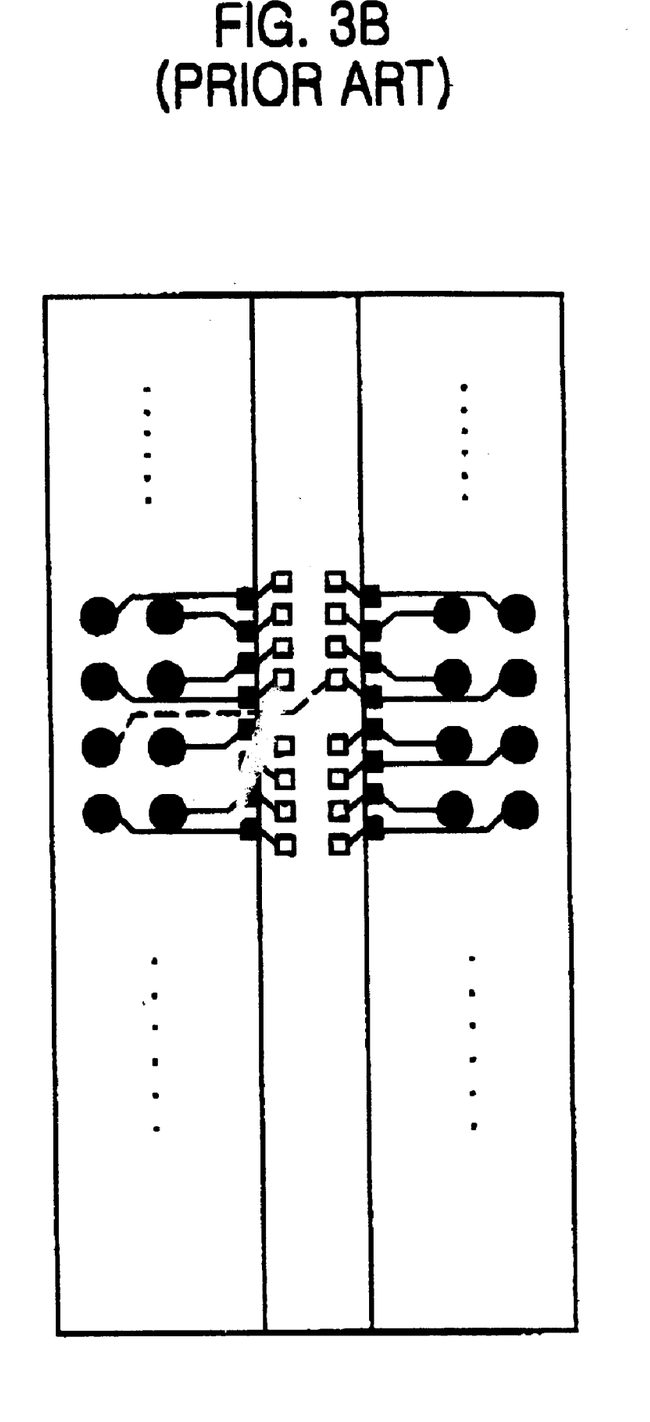
FIG. 3b is a top view illustrating a 60-pin configuration in a double pad array.

Further, the CSP pin rotation in FIG. 3a is presented by a U.S. company, Micron Technology, Inc. There is no problem of the routing layer in case LOC pad array is single pad array, however, in case chip itself adapts to the double pad array, there is a problem. For example, as shown in FIG. 3b, a pin allocated to the left side should be connected to a die pad allocated on the right of the double pad array. It is impossible for this pin across to be applicable to the practical fabrication.

SUMMARY OF THE INVENTION

It is, therefore, an object of the present invention to provide the CSP pin rotation which is be compatible with the TSOP pin rotation.

Another object of the present invention is to provide a memory device, of which chip pads simultaneously adapt to CSP and TSOP pin rotations.

In accordance with another aspect of the present invention, there is provided a CSP semiconductor device, comprising: a die pad area formed in the middle of a semiconductor chip; a first ball pad area allocated at a left side of the die pad area, having a ball array having first and second columns; and a second ball pad area allocated at a right side of the die pad area, having a ball array having first and second columns, wherein the first ball pad area includes ball pads which are positioned at a right side of a corresponding TSOP, wherein the second ball pad area includes ball pads which are positioned at a left side of the corresponding TSOP, wherein the first column of the first ball pad area includes even number pins of the corresponding TSOP, which are disposed in order, of lower priority, and the second column of the first ball pad area includes odd number pins of the corresponding TSOP, which are disposed in order of lower priority, and wherein the first column of the second ball pad area includes even number pins of the corresponding TSOP, which are disposed in order of higher priority, and the second column of the second ball pad area includes odd number pins of the TSOE, which are disposed in order of higher priority.

In accordance with another aspect of the present invention, there is provided a CSP semiconductor device, comprising: a die pad area formed in the middle of a semiconductor chip; a first ball pad area allocated at a left side of the die pad area, having a ball array having first and second columns; and a second ball pad area allocated at a right side of the die pad area, having a ball array having first and second columns, wherein the first ball pad area includes ball pads which are positioned at a right side of a corresponding TSOP, wherein the second ball pad area includes ball pads which are positioned at a left side of the corresponding TSOP, wherein the first column of the first ball pad area includes odd number pins of the corresponding TSOP, which are disposed in order of lower priority, and the second column of the first ball pad area includes even number pins of the corresponding TSOP, which are disposed in order of lower priority, and wherein the first column of the second ball pad area includes odd number pins of the corresponding TSOP, which are disposed in order of higher priority, and the second column of the second ball pad area includes even number pins of the TSOP, which are disposed in order of higher priority.

In accordance with further another aspect of the present invention, there is provided a CSP semiconductor device, comprising: a die pad area formed in the middle of a semiconductor chip; and first and second ball pad areas which are respectively formed at left and right sides of the die pad area, wherein the first ball pad areas has first and second ball array columns and the second ball pad areas has third and fourth ball array columns, wherein first ball pads corresponding to pins to be positioned at a right side of TSOP die pads are allotted to the first and second ball array columns of the first ball pad area in this order, wherein TSOP pin numbers of the first ball pads allotted to the first ball array column are higher than those allotted to the second ball array column in the same row, wherein second ball pads corresponding to pins to be positioned at a left side of the TSOP die pads are allotted to the third and fourth ball array columns of the second ball pad area in this order and wherein the TSOP pin numbers of the second ball pads allotted to the third ball array column are higher than those allotted to the fourth ball array column in the same row.

In accordance with still another aspect of the present invention, there is provided a method for arranging pins to a CSP in order for die pads of the semiconductor device to be compatible with a TSOP, the method comprising the steps of: a) allotting first ball pads arranged at a left side of the TSOP to a right side of the CSP, wherein the first ball pads of the TSOP are, in this order, allotted to each row of a first ball array of the CSP; and b) allotting second ball pads arranged at a right side of the TSOP to a left side of the CSP, wherein the second ball pads of the TSOP are, in this order, allotted to each row of a second ball array of the CSP, wherein the first ball array is opposite to the second ball array.

BRIEF DESCRIPTION OF THE DRAWINGS

Other objects and aspects of the invention will become apparent from the following description of the embodiments with reference of the accompanying drawings, in which.

DETAILED DESCRIPTION OF THE PREFERRED EMBODIMENTS

Hereafter, the present invention will be described in detail with reference to the accompanying drawings.

Figure 4:
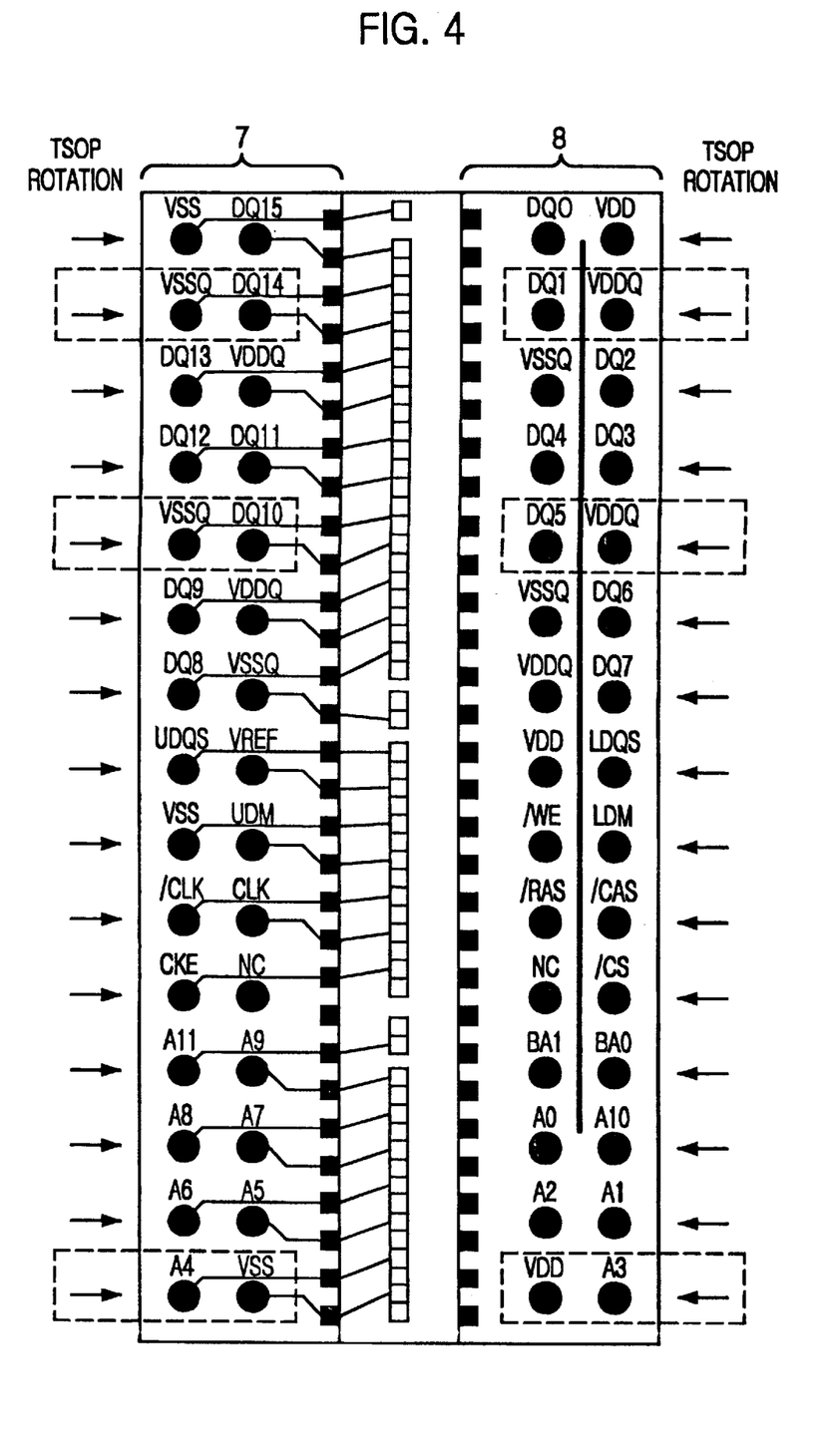
FIG. 4 is a top view illustrating a 60-pin configuration of the CSP according to the present invention, in which the 60-pin configuration is compatible with the TSOP of the FIG. 1.

FIG. 4 is a top view illustrating a 60-pin configuration of the CSP according to the present invention, in which the 60-pin configuration is compatible with the TSOP of the FIG. 1. In the drawing, the reference numeral 7 denotes a left side of the CSP and 8 a right side of the CSP. The chip to which the present invention is applied has a structure having a LOC (Lead on Center) pad for the connection with an outer package on a semiconductor die and has a pad array comprising one or a plurality of columns. Further, the die pads are connected to ball pads by lead frames and the ball pads are connected to the outer package, such PCB or metal wire, by the pins.

Comparing the pin configuration of FIG. 3a with that of FIG. 4, the reverse arrangement in the second, fifth and fifteen rows, which are described in FIG. 3a, is not shown in FIG. 4. This reverse arrangement of FIG. 3a is caused by positioning the data pins at the outside of the ball pad array as possible as for preventing a data skew. However, this reverse arrangement doesn't perfectly prevent the data skew because it is impossible to position all data pins at the outside of the ball pad array. Some ball pads may inevitably position at the inside of the ball pad array because the ball pads should not be far away from the die pads.

The present invention takes no account of this data pin configuration rule. That is, the pin configuration of the CSP according to the present invention is consistent with that of the TSOP. Accordingly, when die pads are designed, it is not necessary to consider the ball pads for the CSP and the TSOP. In FIG. 3a, if such a data pin configuration rule perfectly removes the data skew, the removal of it may not bring many troubles upon the device characteristics because tale final data output depends on the latest output data.

Referring to FIG. 4, the ball pads corresponding to the pins, which are positioned at the right side 2 of the TSOP (FIG. 1), are positioned at the left side 7 of the CSP. Also, the ball pads corresponding to the even number pins of FIG. 1 are positioned at the first column and the ball pads corresponding to the odd number pins of FIG. 1 are positioned at the second column.

For example, assuming that the pins in the left side 1 of the TSOP are allotted to the ball pad array having 2 columns at the right side 8 of the CSP, the pins in the left side 1 of the TSOP are, in order, allotted to the ball pads at row 1 of column 2, row 1 of column 1, row 2 of column 2, row 2 of column 1, row 3 of column 2, row 3 of column, 1, row 4 of column 2, . . . , row 15 of column 2, row 15 of column 1 of the right side 8 of the CSP, respectively.

Also, if the pins in the right side 2 of the TSOP are allotted to the ball pad array having 2 columns at the left side 7 of the CSP, the pins in the right side 2 of the TSOP are correspondingly allotted to the ball pads at row 1 of column 1, row 1 of column 2, row 2 of column 1, row 2 of column 2, row 3 of column 1, row 3 of column 2, row 4 of column 1, row 4 of column 2, . . . , row 15, column 1, row 15 of column 2 of the left pad of the CSP, respectively.

On the other hand, if the pins in the right side 2 of the TSOP are allotted to the ball pad array having 3 columns at the left side 8 of the CSP, the pins in the right side 2 of the TSOP are correspondingly allocated to the ball pads at row 1 of column 1, row 1 of column 2, row 1 of column 3, row 2 of column 1, row 2 of column 2, row 2 of column 3, row 3 of column 1, row 3 of column 2, row 4 of column 3, . . . , row 15 of column 1, row 15 of column 2 and row 15 of column 3 of the left pad of the CSP, respectively.

As illustrated in the drawings, the CSP pin configuration according to the embodiments of the present invention corresponds to the TSOP pin configuration. According to the pin configuration of the present invention, there are two merits that the CSP pin configuration of the present invention is compatible with the TSOP pin configuration and there exists always only single routing wire between the pitch of ball and ball.

As a result, the present invention prevents two wires from passing between the balls in the CSP, by positioning the ball pad VSSQ at the outside of the ball pad array and by positioning the ball pads DQ14 and DQ10 at the inside thereof. When this pin configuration according to the present invention is applied to the semiconductor package, separate die pad designs are not needed for the CSP or TSOP pin configuration.

The pinout of 64M DDR SDRAM is exemplarily illustrated in this embodiment, but it is possible to apply this pin configuration to all packages of LOC type.

Figure 5A:
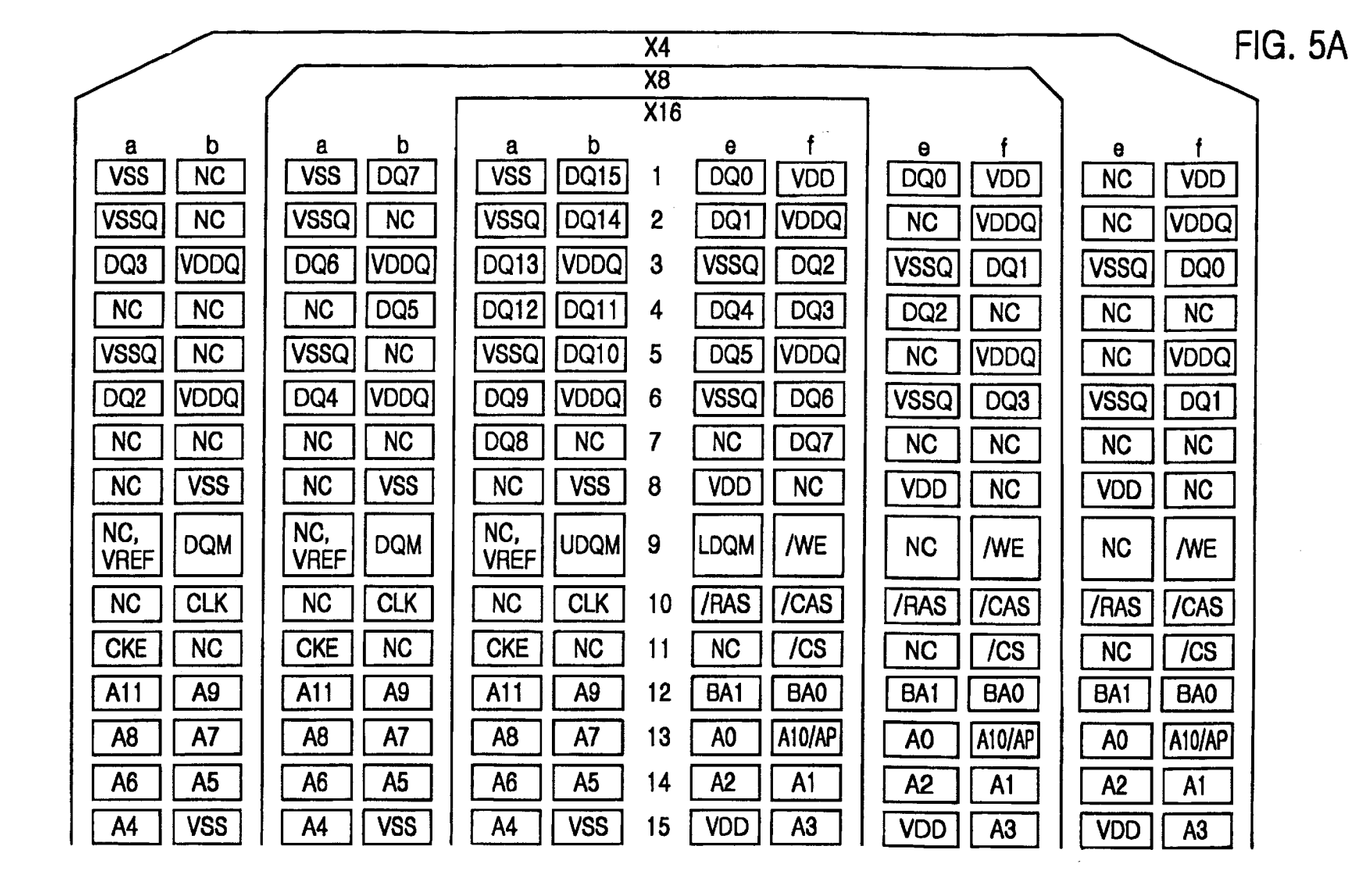
FIG. 5a is a top view illustrating a 60-pin configuration of the CSP of 64M SDR SDRAM according to the present invention.

For example, FIG. 5a is a top view implementing a 60-pin configuration of the CSP of 64M SDR SDRAM according to the present invention and represents a pin configuration of each multi-bit SDR SDRAM of X4 (4 data pins), X8 (8 data pins) and X16 (16 data pins).

Figure 5B:
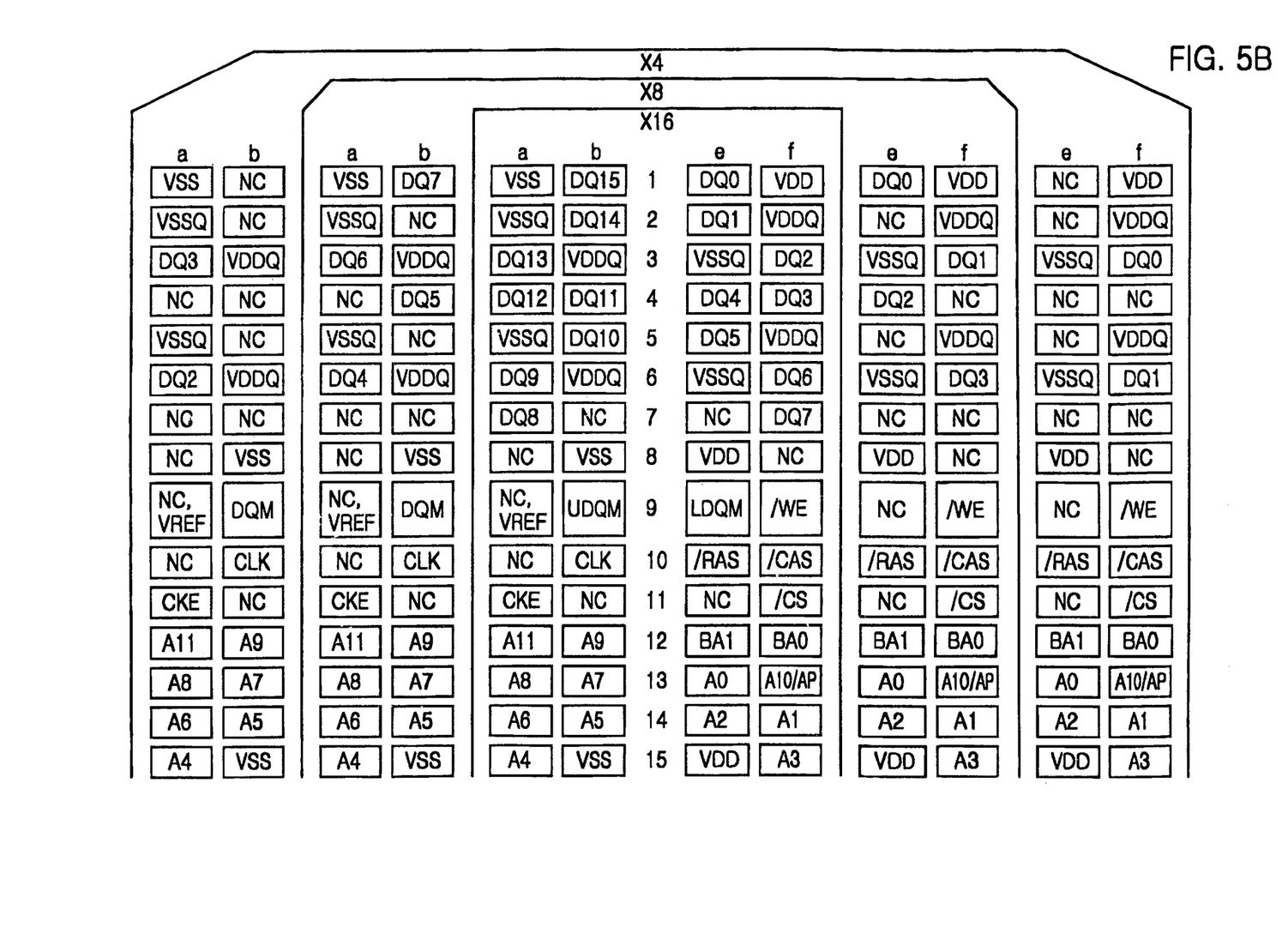
FIG. 5b is a top view illustrating a 60-pin configuration of the CSP of 128M SDR SDRAM according to an embodiment of the present invention.

In such a manner, FIG. 5b is a top view implementing a 60-pin configuration of the CSP of 128M SDR SDRAM according to the present invention and represents a pin configuration of each multi-bit SDR SDRAM of X4, X8 and X16.

Figure 5C:
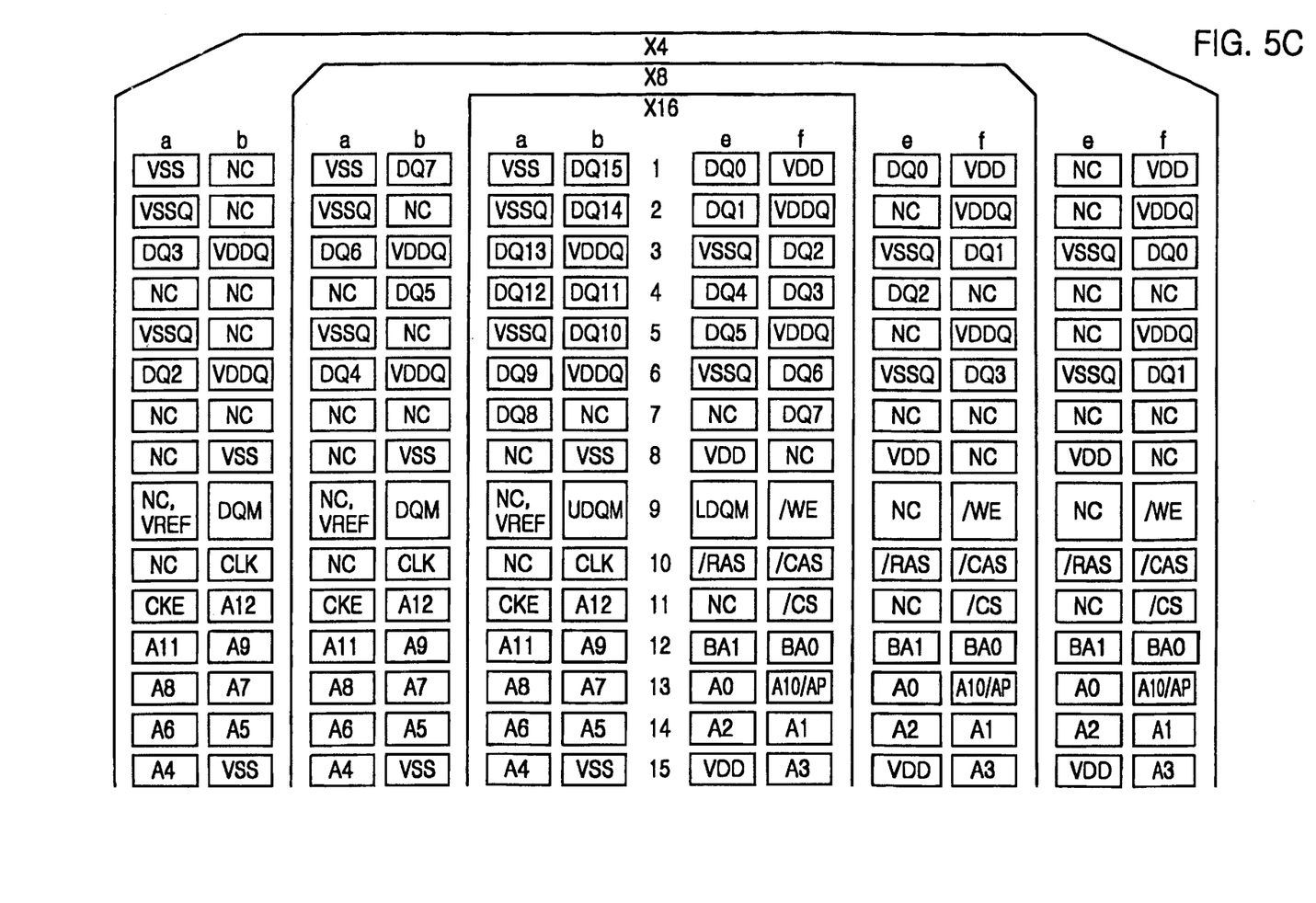
FIG. 5c is a top view illustrating a 60-pin configuration of the CSP of 256M SDR SDRAM according to the present invention.

FIG. 5c is a top view implementing a 60-pin configuration of the CSP of 256M SDR SDRAM according to the present invention and represents a pin configuration of each multi-bit SDR SDRAM of X4, X8 and X16.

FIG. 5b is a top view implementing a 60-pin configuration of the CSP of 128M SDR SDRAM according to the present invention and represents a pin configuration of each multi-bit SDR SDRAM of X4, X8 and X16.

FIG. 5c is a top view implementing a 60-pin configuration of the CSP of 256M SDR SDRAM according to the present invention and represents a pin configuration of each multi-bit SDR SDRAM of X4, X8 and X16.

Figure 6A:
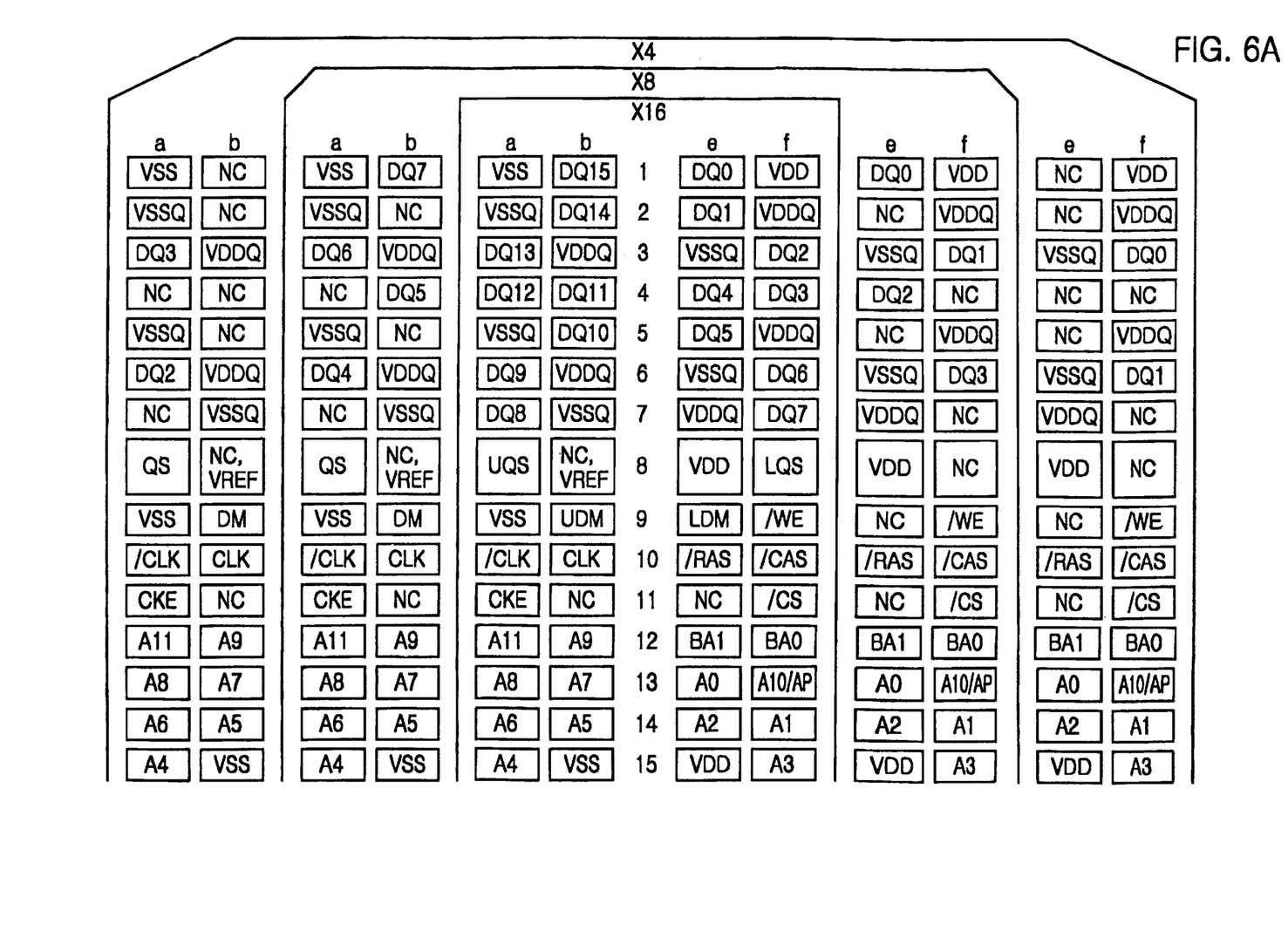
FIG. 6a is a top view illustrating a 60-pin configuration of the CSP of 64M DDR SDRAM according to the present invention.

FIG. 6a is a top view implementing a 60-pin configuration of the CSP of 64M SDR SDRAM according to the present invention and represents a pin configuration of each multi-bit DDR SDRAM of X4, X8 and X16.

Figure 6B:
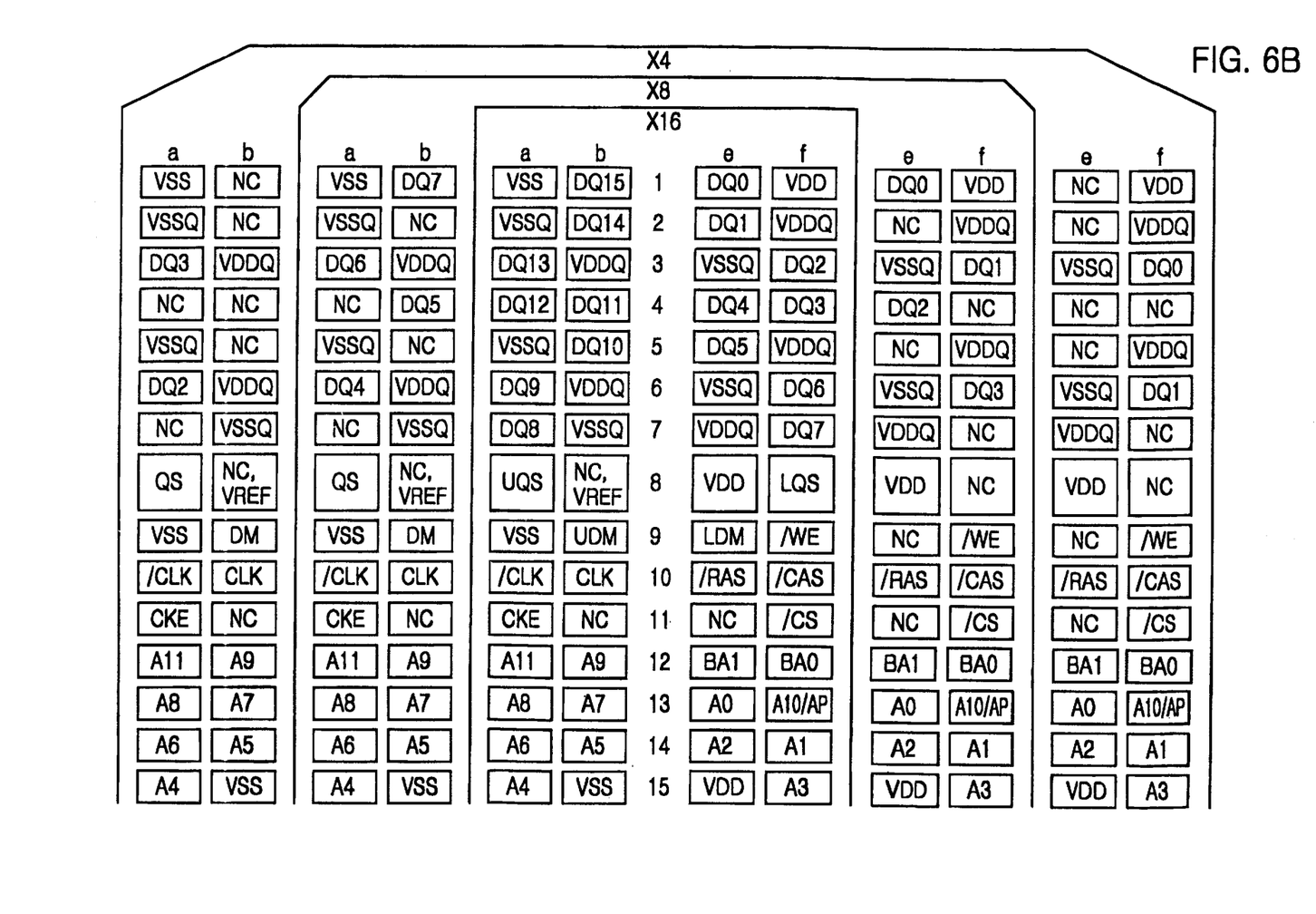
FIG. 6b is a top view illustrating a 60-pin configuration of the CSP of 128M DDR SDRAM according to the present invention.

FIG. 6b is a top view implementing a 60-pin configuration of the CSP of 128M SDR SDRAM according to the present invention and represents a pin configuration of each multi-bit DDR SDRAM of X4, X8 and X16.

Figure 6C:
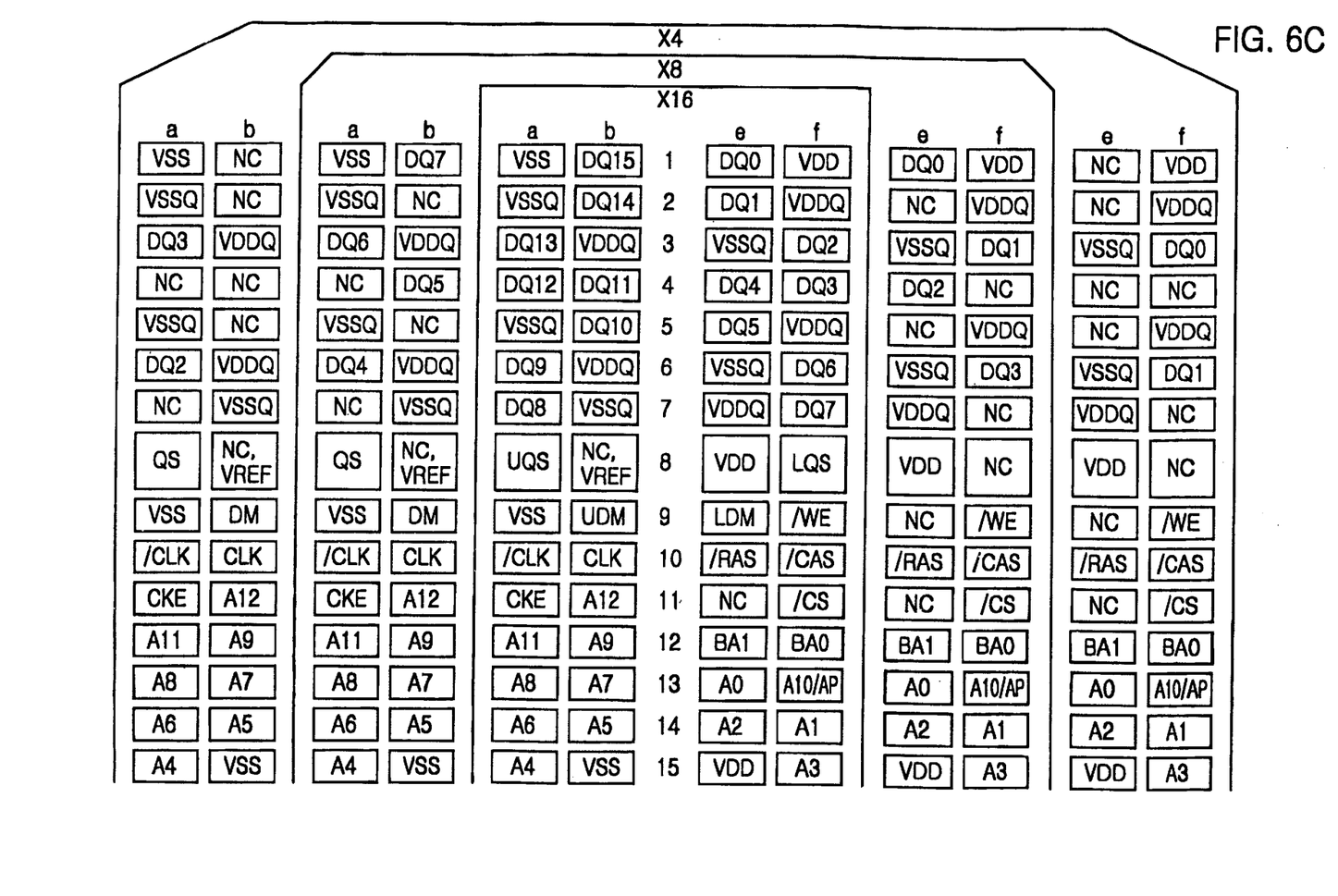
FIG. 6c is a top view illustrating a 60-pin configuration of the CSP of 256M DDR SDRAM according to the present invention.

FIG. 6c is a top view implementing a 60-pin configuration of the CSP of 256M SDR SDRAM according to the present invention and represents a pin configuration of each multi-bit DDR SDRAM of X4, X8 and X16.

Further, it is possible to apply the present invention to double or more LOC types as well as the pad array of single LOC type.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A CSP semiconductor device, comprising:
   a die pad area formed in the middle of a semiconductor chip;
   a first ball pad area allocated at a left side of the die pad area, having a ball array having first and second columns; and
   a second ball pad area allocated at a right side of the die pad area, having a ball array having first and second columns,
   wherein the first ball pad area includes ball pads which are positioned at a right side of a corresponding TSOP, wherein the second ball pad area includes ball pads which are positioned at a left side of the corresponding TSOP, wherein the first column of the first ball pad area includes even number pins of the corresponding TSOP, which are disposed in order of lower priority, and the second column of the first ball pad area includes odd number pins of the corresponding TSOP, which are disposed in order of lower priority, and wherein the first column of the second ball pad area includes even number pins of the corresponding TSOP, which are disposed in order of higher priority, and the second column of the second ball pad area includes odd number pins of the TSOP, which are disposed in order of higher priority.

2. The CSP semiconductor device as recited in claim 1, wherein the even and odd number pins are respectively changed into the odd and even number pins by a no-connection pin.

3. The CSP semiconductor device as recited in claim 1, wherein the die pad area comprises a single pad array.

4. The CSP semiconductor device as recited in claim 1, wherein the die pad area comprises a double pad array having two die pad columns.

5. A CSP semiconductor device, comprising:
   a die pad area formed in the middle of a semiconductor chip;
   a first ball pad area allocated at a left side of the die pad area, having a ball array having first and second columns; and
   a second ball pad area allocated at a right side of the die pad area, having a ball array having first and second columns,
   wherein the first ball pad area includes ball pads which are positioned at a right side of a corresponding TSOP, wherein the second ball pad area includes ball pads which are positioned at a left side of the corresponding TSOP, wherein the first column of the first ball pad area includes odd number pins of the corresponding TSOP, which are disposed in order of lower priority, and the second column of the first ball pad area includes even number pins of the corresponding TSOP, which are disposed in order of lower priority, and wherein the first column of the second ball pad area includes odd number pins of the corresponding TSOP, which are disposed in order of higher priority, and the second column of the second ball pad area includes even number pins of the TSOP, which are disposed in order of higher priority.

6. The CSF semiconductor device as recited in claim 5, wherein the even and odd number pins are respectively changed into the odd and even number pins by a no-connection pin.

7. The CSP semiconductor device as recited in claim 5, wherein the die pad area comprises a single pad array.

8. The CSP semiconductor device as recited in claim 5, wherein the die pad area comprises a double pad array having two die pad columns.

9. The CSF semiconductor device, comprising:
   a die pad area formed in the middle of a semiconductor chip; and
   first and second ball pad areas which are respectively formed at left and right sides of the die pad area, wherein the first ball pad areas has first and second ball array columns and the second ball pad areas has third and fourth ball array columns,
   wherein first ball pads corresponding to pins to be positioned at a right side of TSOP die pads are allotted to the first and second ball array columns of the first ball pad area in this order, wherein TSOP pin numbers of the first ball pads allotted to the first ball array column are nigher than those allotted to the second ball array column in the same row,
   wherein second ball pads corresponding to pins to be positioned at a left side of the TSOP die pads are allotted to the third and fourth ball array column's of the second ball pad area in this order and wherein the TSOP pin numbers of the second ball pads allotted to the third ball array column are higher than those allotted to the fourth ball array column in the same row.

10. The CSP semiconductor device as recited in claim 9, wherein the first and second ball pads of the CSP semiconductor device further comprises ball pads associated with no-connection pins.

11. The CSP semiconductor device as recited in claim 9, wherein the die pad area comprises a single pad array.

12. The CSP semiconductor device as recited in claim 9, wherein the die pad area comprises a double pad array having two die pad columns.

13. In a semiconductor device having LOC (Lead On Chip) pad for interconnection to an external circuit, a method for arranging pins to a CSP in order for die pads of the semiconductor device to be compatible with a TSOP, the method comprising the steps of:
   a) allotting first ball pads arranged at a left side of the TSOP to a right side of the CSP, said right side including at least a first ball array column and a second ball array column within a first ball array, wherein the first ball pads of the TSOP are allotted to each row of said first ball array of the CSP such that the TSOP pin numbers of the first ball pads allotted to the first ball array column are higher than those allotted to the second ball array column in the same row; and
   b) allotting second ball pads arranged at a right side of the TSOP to a left side of the CSP, said left side of said CSP including at least a third ball array column and a fourth ball array column within a second ball array, wherein the second ball pads of the TSOP are allotted to each row of said second ball array of the CSP such that the TSOP pin numbers of the second ball pads allotted to the third ball array column are higher than those allotted to the fourth ball array column in the same row.

14. The method as recited in claim 13, wherein the step a) further includes arranging the first ball pads of the TSOP from higher row to lower row of the first ball array of the CSP, and wherein the step b) further includes arranging the second ball pads of the TSOP from higher row to lower row of the second ball array of the CSP.

15. The method as recited in claim 13, wherein the first ball array includes a first column, a second column and a third column and wherein the second ball array includes a fourth column, a fifth column and a sixth column.

16. The method as recited in claim 15, wherein the step a) further comprises the step of allotting the first ball pads arranged at the left side of the TSOP to the first, second and third columns which are positioned at the right side of the CSP, wherein the first ball pads of the TSOP are arranged from higher row to lower row of the first ball array of the CSP, and wherein the step b) further comprises the step of allotting the second ball pads arranged at the right side of the TSOP to the fourth, fifth and sixth columns which are positioned at the left side of the CSP, wherein the second ball pads of the TSOP are arranged from higher row to lower row of the second ball array of the CSP.

17. The method as recited in claim 13, wherein the first ball array column includes even number pins of the corresponding TSOP, which are disposed in order of lower priority, and the second ball array column includes odd number pins of the corresponding TSOP, which are disposed in order of lower priority.

18. The method as recited in claim 13, wherein the third ball array column includes even number pins of the corresponding TSOP, which are disposed in order of higher priority, and the fourth ball array column includes odd number pins of the corresponding TSOP, which are disposed in order of higher priority.

* * * * *